United States Patent [19]

Bockelman et al.

[11] Patent Number: 5,471,010
[45] Date of Patent: Nov. 28, 1995

[54] SPATIALLY SEPARATED UNINSULATED TWISTED WIRE PAIR

[75] Inventors: David E. Bockelman, Plantation; Douglas H. Weisman, Sunrise, both of Fla.

[73] Assignee: Motorola, Inc., Schaumburg, Ill.

[21] Appl. No.: 330,877

[22] Filed: Oct. 28, 1994

Related U.S. Application Data

[63] Continuation-in-part of Ser. No. 299,857, Sep. 1, 1994, which is a continuation of Ser. No. 115,174, Aug. 31, 1993, abandoned.

[51] Int. Cl.⁶ .................................................. H01B 11/06
[52] U.S. Cl. ........................... 174/36; 29/825; 174/34
[58] Field of Search ................................. 361/772–778; 174/32–34, 36; 29/525, 828–832

[56] References Cited

U.S. PATENT DOCUMENTS

| | | |
|---|---|---|
| 3,486,076 | 12/1969 | Abbott et al. . |
| 3,643,133 | 2/1972 | Towell . |
| 3,644,792 | 2/1972 | Fields . |
| 3,981,076 | 9/1976 | Nicolas . |
| 4,313,149 | 1/1982 | Hirose et al. . |
| 4,626,889 | 12/1986 | Yamamoto et al. . |
| 4,686,492 | 8/1987 | Grellmann et al. . |
| 4,825,155 | 4/1989 | Takamine . |
| 4,831,497 | 5/1989 | Webster et al. . |
| 4,858,063 | 8/1989 | Laue et al. .............................. 361/286 |
| 5,039,824 | 8/1991 | Takashima et al. . |
| 5,221,895 | 6/1993 | Janko et al. . |

*Primary Examiner*—Bot L. Ledynh
*Attorney, Agent, or Firm*—Frank M. Scutch, III

[57] ABSTRACT

A radio frequency electrical connection (600) between a pair of electrical devices is formed by a pair of uninsulated bond wires (601, 603). The uninsulated bond wires (601, 603) are twisted in a manner such that the wires form a twisted pair but do not physically touch each other over the length of the twisted section.

6 Claims, 7 Drawing Sheets

SPATIALLY SEPARATED UNINSULATED TWISTED WIRE PAIR

CROSS REFERENCE TO RELATED APPLICATIONS

This application is a continuation-in-part of U.S. application Ser. No. 08/299,857, filed Sep. 1, 1994, which is a continuation of Ser. No. 08/115,174, filed Aug. 31, 1993, now abandoned. It is also related to the following U.S. applications: Ser. No.: 08/115,175 by David E. Bockelman and Douglas H. Weisman, entitled "A Horizontally Twisted-Pair Planar Conductor Line Structure," to Ser. No. 08/115,368 by David E. Bockelman, entitled "A Vertically Twisted-Pair Conductor Line Structure," to Ser. No. 08/115,176 by David E. Bockelman, entitled "A Twisted-Pair Planar Conductor Line Off-Set Structure," and to Ser. No. 08/115,291 by David E. Bockelman and Robert E. Stengel, entitled "Interconnection Structure for Crosstalk Reduction to Improve Off-Chip Selectivity," all filed concurrently herewith and all assigned to Motorola, Inc.

FIELD OF THE INVENTION

This invention relates to circuit interconnection and more particularly to the elimination of crosstalk in electrical devices.

BACKGROUND

Small integrated circuit (IC) elements, dies, or chips, such as a radio frequency (RF) amplifier on a radio chip, are sometimes connected to an off-chip device. These off-chip devices include other semiconductor or hybrid circuits as well as other integrated circuits such as an off-chip filter. One way of attaching the IC to an off-chip device utilizes a wire bonding technique. This entails using a wire bonding machine to fuse small wires to the contact points or bond pads of small IC chips at one end and attach to an off-chip device at the opposite end.

In both hybrid circuits and IC chips, one or more devices may be carried by a ceramic substrate. For example, high frequency signals, such as RF signals, can be transmitted via a transmission line structure formed on one of the devices. The RF signals may be transmitted to any number of off-chip devices such as a surface acoustical wave (SAW) filters or the like. The transmission line is usually formed by any two conductors or wires which are insulated from each other.

It is at the interface between the transmission line of a off-chip device and a small IC die of the RF device that a bond wire connection is made. The transmission line of the off-chip device is fully capable of handling radio frequencies, yet a crosstalk problem is often encountered when attempting to connect an IC die to the off-chip transmission line.

When any two or more circuits are interconnected on different electrical devices having substrates, such as printed circuit boards, IC's or other types of carriers, by a standard transmission line, a certain amount of signal from one circuit may couple into an otherwise isolated circuit. The resulting induced signal is called crosstalk. This situation can be a problem, for example, in a radio transceiver, when an RF high frequency signal source, such as an antenna received radio frequency RF signal, is routed from an RF amplifier in one substrate, to an RF filter, in another substrate. Under these conditions crosstalk can occur.

If one of the two conductors of the transmission line coupling the circuits is used as a grounding conductor, the circuit is referenced as single-ended and the transmission line is a single-ended transmission line. Otherwise, two non-grounded conductors form a differential transmission line for a differential circuit. The geometry of the two conductors, and their relative positions, are set to establish a characteristic impedance to properly match the impedance from the first differential circuit to the subsequent differential circuit. A differential signal is applied across the two conductors by one differential generating circuit, and the signal travels down the transmission line to the differential receiving circuit, where the signal is measured as the difference between the two conductors. In other words, a differential circuit generates or receives a pair of complementary signals in a phase-inverted relation with each other, known together as a single differential signal.

The substitution of a differential or wire bond pair transmission line for a single-ended wire bond transmission line can greatly reduce at least one type of crosstalk or coupling called common-mode impedance coupling. Common-mode impedance coupling in a single-ended (non-differential) transmission line is caused by a non-zero parasitic impedance, generally called a ground-return impedance, comprised of reactive and resistance components, unintentionally shared by two or more otherwise isolated circuits. This common impedance causes crosstalk. Therefore, by reducing the common or shared impedance of the ground conductor with a non-grounded conductor, common-mode impedance coupling is reduced. In addition to common impedance coupling between circuits, there can also be capacitive (electric) and inductive (magnetic) coupling between the two conductors of the same transmission line if the two conductors are close together.

In the case of two adjacent; transmission lines, differential transmission lines can also reduce the capacitive, or electric field, coupling and inductive, or magnetic field, coupling between the differential transmission lines, relative to single-ended transmission lines, if the distance between the, two transmission lines is much larger than the separation between the conductors of one of the transmission lines. However, space is generally limited in these miniaturized applications, such as in a radio. Therefore, these differential transmission lines must be close together. This close situation increases the magnetic coupling and decreases the advantage of differential lines over single-ended lines.

FIG. 1 illustrates a prior art figure depicting two adjacent circuits 101, 102, each of which is implemented on both substrates 103, 104. The wire bond pairs 110, 111, as implemented in the prior art, are substantially parallel. The RF signal source is represented by the voltage Vi 120. The crosstalk is represented by the voltage Vx 121 on the adjacent circuit 102. FIG. 2 shows a typical plot of crosstalk versus frequency as a ratio of the voltages Vx to Vt. FIG. 2 is representative of the crosstalk present between two such otherwise isolated circuits 101, 102 as shown in FIG. 1, with a separation of approximately 200 microns.

A further reduction in crosstalk, over the plain differential line, for the two close conductors of the same differential line or for two close differential lines, can be achieved by twisting the two conductors to form a twisted-pair differential transmission line. This type of line is commonly implemented with two insulated round wires which are twisted about each other. This type of line can reduce crosstalk by reducing the inductive, or magnetic field, coupling. The crosstalk reduction is achieved by reducing the magnetic loop area of the line, and by changing the orientation of the magnetic field continuously over the length of the line. A problem associated with this type of twisted pair is that insulation is required since the wires are in intimate contact. This prevents a short which would defeat the benefits and crosstalk reduction of the ability of the twisted pair.

An un-twisted pair defines a magnetic, or current, loop area over the entire length of the differential transmission line, with the wires being the long sides of a "rectangle". The area of such a loop defines the amount of current that can be induced in the wires by an external magnetic field, such as from an adjacent conductor.

By twisting or crossing the wires, the loop area is minimized. The dimensions of the wire, and the number of twists per inch define the transmission lines characteristic impedance. Furthermore, the remaining loop is now twisted down the length of the transmission line, so that the normal to the magnetic loop area traces a helix or spiral.

When interconnecting miniature circuits, such as printed circuits on a printed circuit board or a flexible circuit substrate, ICs on a semiconductor substrate, or hybrid circuits, the concept of twisted-pair differential transmission lines can be applied to reduce crosstalk. However, when connecting miniature circuits on two separate substrates with typical wire bonds, all the interconnections between substrates, even if the circuits are twisted-pair differential, are implemented by bond wires that are substantially parallel, as shown in FIG. 1, and these parallel interconnections can lead to significant crosstalk. As seen in prior art FIG. 2, a graph of the representative crosstalk function as shown in FIG. 1 is illustrated versus frequency. As can be clearly seen, the crosstalk function increases and then remains relatively constant with increasing frequency.

Therefore, it should be evident that there is a need to eliminate crosstalk easily and at a low cost without adding an excessive number of components. In order to meet this need, the device should be comprised of common materials and manufactured with tools and machinery capable of quickly and inexpensively creating a device to eliminate circuit coupling and cross-talk. This provides better circuit operation and an increase in overall efficiency between electrical circuits in close proximity.

DETAILED DESCRIPTION OF THE PREFERRED EMBODIMENT

Figure 3:
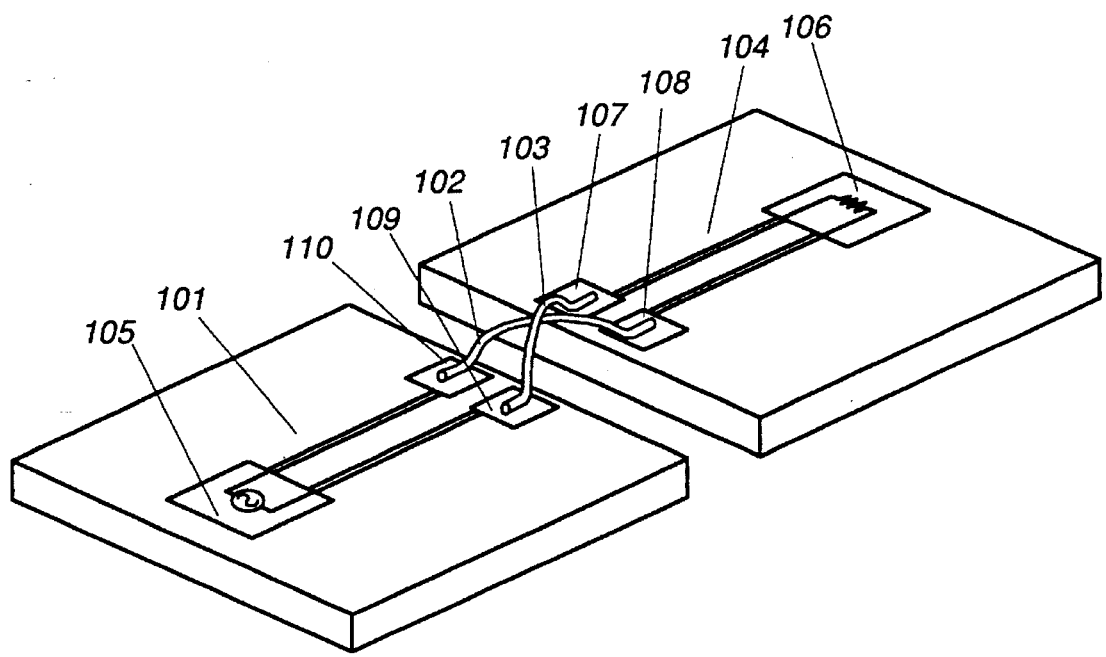
FIG. 3 is a isometric view of a twisted-pair wire bond connection having one twist, in accordance with the present invention.
Figure 4:
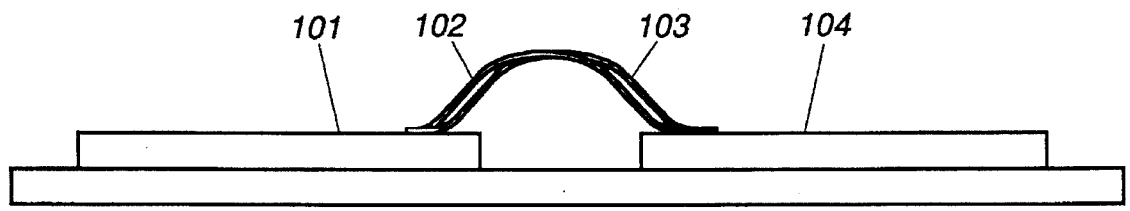
FIG. 4 is a side view of the twist of FIG. 3 located on top of a carrier substrate.

Referring to FIG. 3, a twisted pair of wire bonds is shown connecting any two electrical devices. This twisted wire-bond pair is an approximation to the true twisted pair of two insulated round wires because the bond wires 102 and 103 are uninsulated bonding wires, twisted once in accordance with the present invention. The wires 102 and 103 are attached to the two electrical devices, such as substrates 101 and 104 through any appropriate bonding method. The wires 102 and 103 connect the two miniaturized differential circuits 105 and 106 through contact points, bonding areas, or pads 107, 108, 109 and 110. A first wire 103 is attached first in a generally curvilinear path. Then, a second wire 102 is curvilinearly attached so as to cross over or traverse the first wire 103 without touching. This crossing of the wires 102 and 103 is shown in FIG. 4, from a different perspective. In this case, the bottom common carrier could be a ceramic or a printed circuit substrate of a hybrid for carrying an off-chip filter and a radio die.

Figure 5:
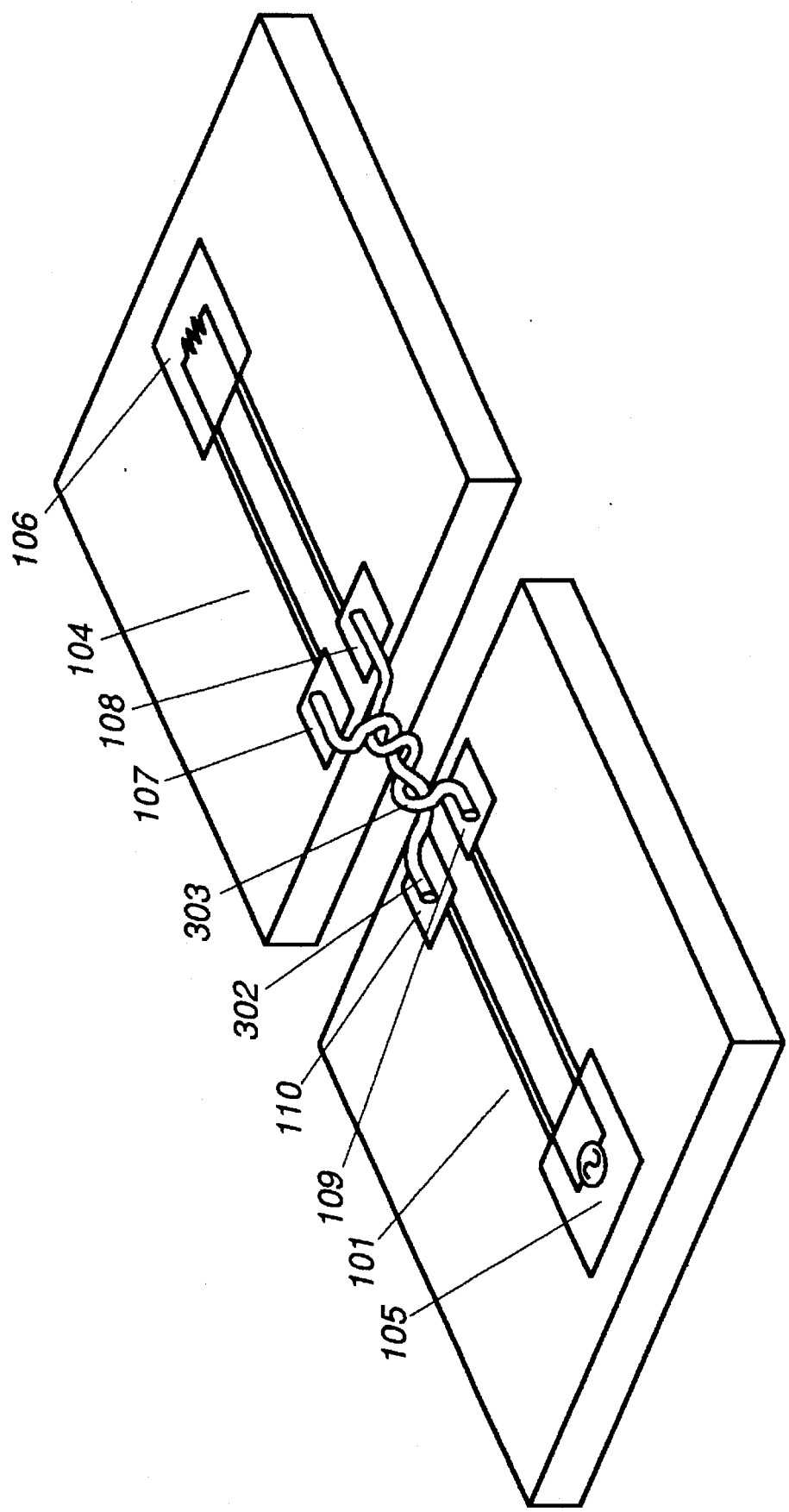
FIG. 5 is an isometric top view of a twisted pair wire bond structure having multiple twists, in accordance with one embodiment of the invention.

Referring to another embodiment of the invention in FIG. 5, two wires 302 and 303 are twisted together in intimate contact, with multiple twists to produce a twisted pair. Each bond wire 302, 303 follows a predetermined spiraling path, such that the pair of bond wires are substantially helically wound in opposed directions. At least one wire 303, and optionally both wires, must be sheathed with electrical insulation over the twisted portion of the wire bonds. Additionally, such bonding wire as used in FIG. 3 can be used to manufacture large numbers of twisted pair wire bonds.

Figure 6:
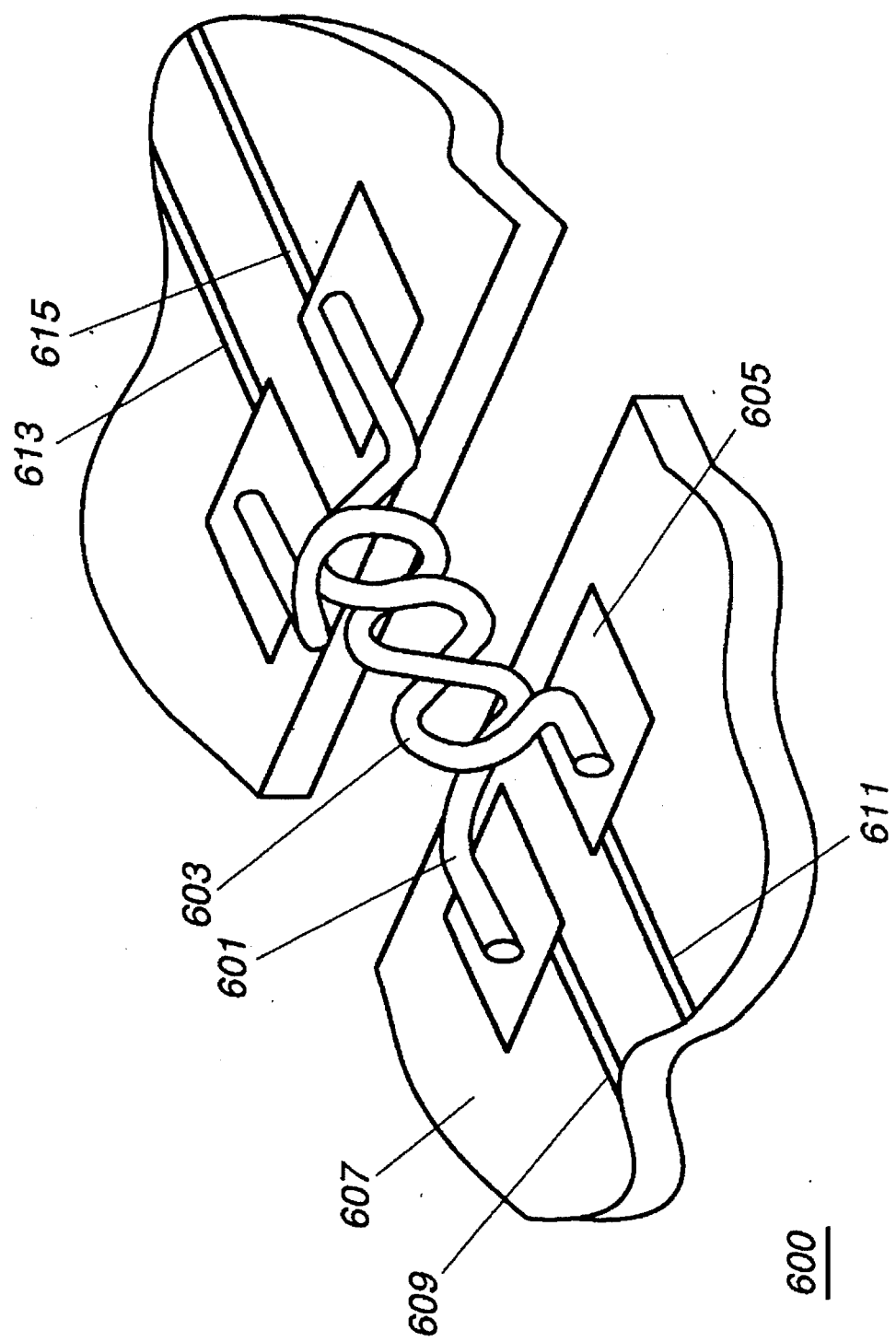
FIG. 6 is a isometric view of a twisted-pair wire bond connection having spatially separated multiple twists, in accordance with another embodiment invention.

In still yet another embodiment of the invention, FIG. 6 illustrates a spatially separated twisted wire pair shown generally at 600. The twisted pair includes a uninsulated bond wire 601 and a uninsulated bond wire 603 which are twisted about one another so as to form a helix like shape. Since both bond wires 601 and 603 are bare or uninsulated, it is important that no physical contact is made between either of these wires. If the wires were to touch or short, the functionality of the spatially separated twisted pair would be defeated. Both uninsulated bond wire 601 and second uninsulated bond wire 603 are typically made of bond-type wire made of highly conductive material such as copper or the like. This type of wire offers the advantage of easily be applied and manipulated using a standard wire bond machine. The spatially separated twisted pair 600 is then connected to a connection pad 605 where it may be soldered, ultrasonically welded or bonded using any type of conventional attachment technique. Connection pad 605 is comprised of conductive material such as copper or the like and typically sits atop a substrate 607 along with a runners 609–615. Runners 609–615 are standard conductive runners which also are made of copper or the like which lead to an RF device (not shown) which is positioned on substrate 607.

With regard to making the preferred embodiment of the invention as shown in FIG. 6, the method includes forming a spatially separated uninsulated twisted pair structure using a number of steps. These include positioning a first uninsulated bond wire adjacent to a second uninsulated bond wire. Further, the first uninsulated bond wire and second uninsulated bond wire are twisted about one another such that the first uninsulated bond wire and the second uninsulated bond wire form a spiral or helical shape but do not come into physical contact. This produces a spatially separated twisted pair which need not use insulated wire like previously structures since the first and second wires do not touch. The preferred method may be used with a standard wire bonding machine or the like and forms a spatially separated twisted pair device which is inexpensive and uses common materials.

Figure 7:
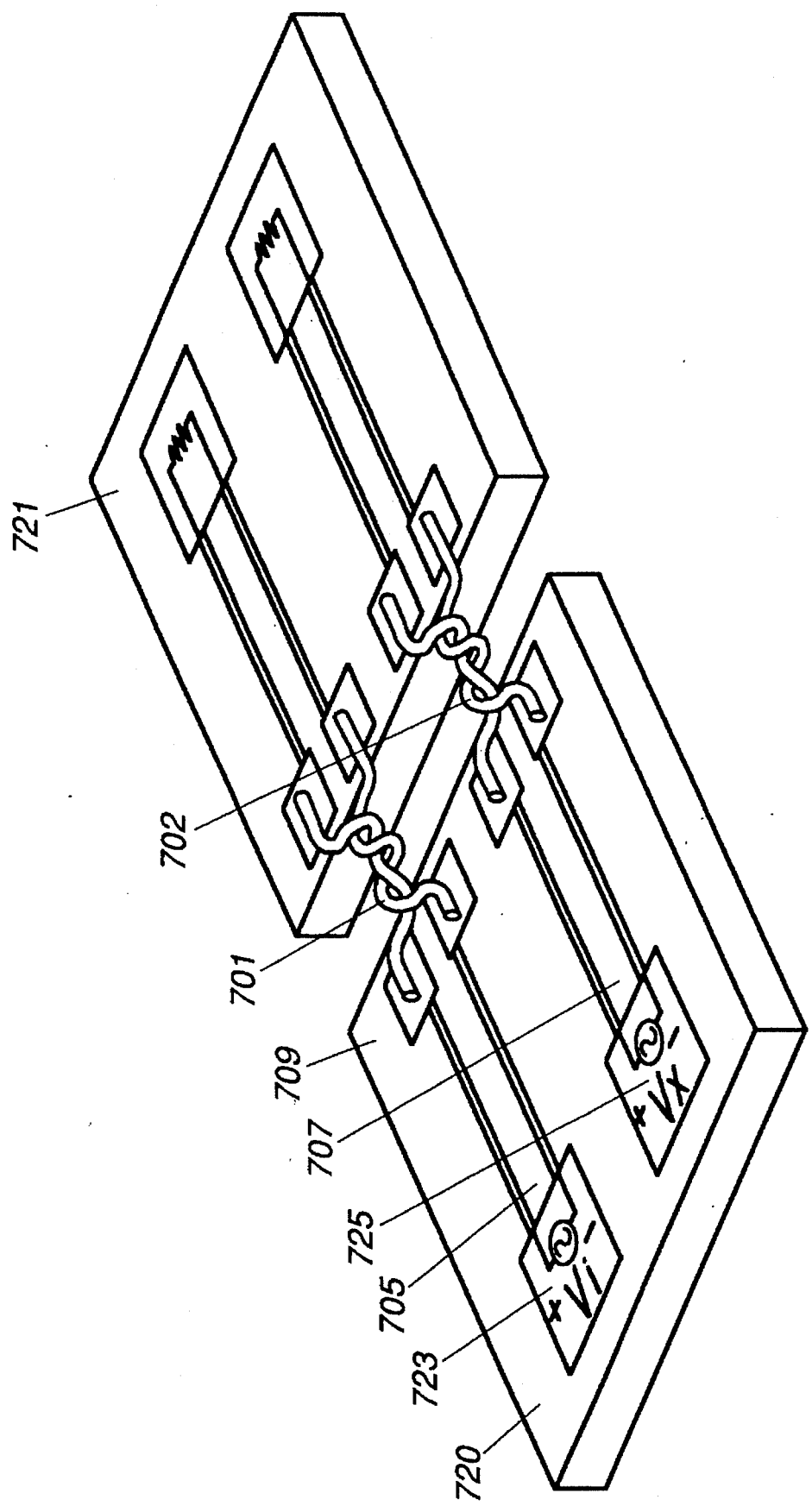
FIG. 7 is a isometric view of a two spatially separated twisted pair structures showing their use between circuits in close proximity.

FIG. 7 is a isometric view of adjacent wire bond pairs 701, 702 like that shown in FIG. 6. Wire bond pairs 701, 702 are shown substantially in parallel and are each connected to circuits 720 and 721 using a respective pair of runners 705, 707 which are placed on substrate 709. It will be evident to those skilled in the art that although only one circuit 720 is described here, the same features and elements apply to circuit 721. FIG. 7 represents the environment that the uninsulated twisted pair 600 would be used to prevent coupling and resulting crosstalk between circuits 720, 721.

Figure 1:
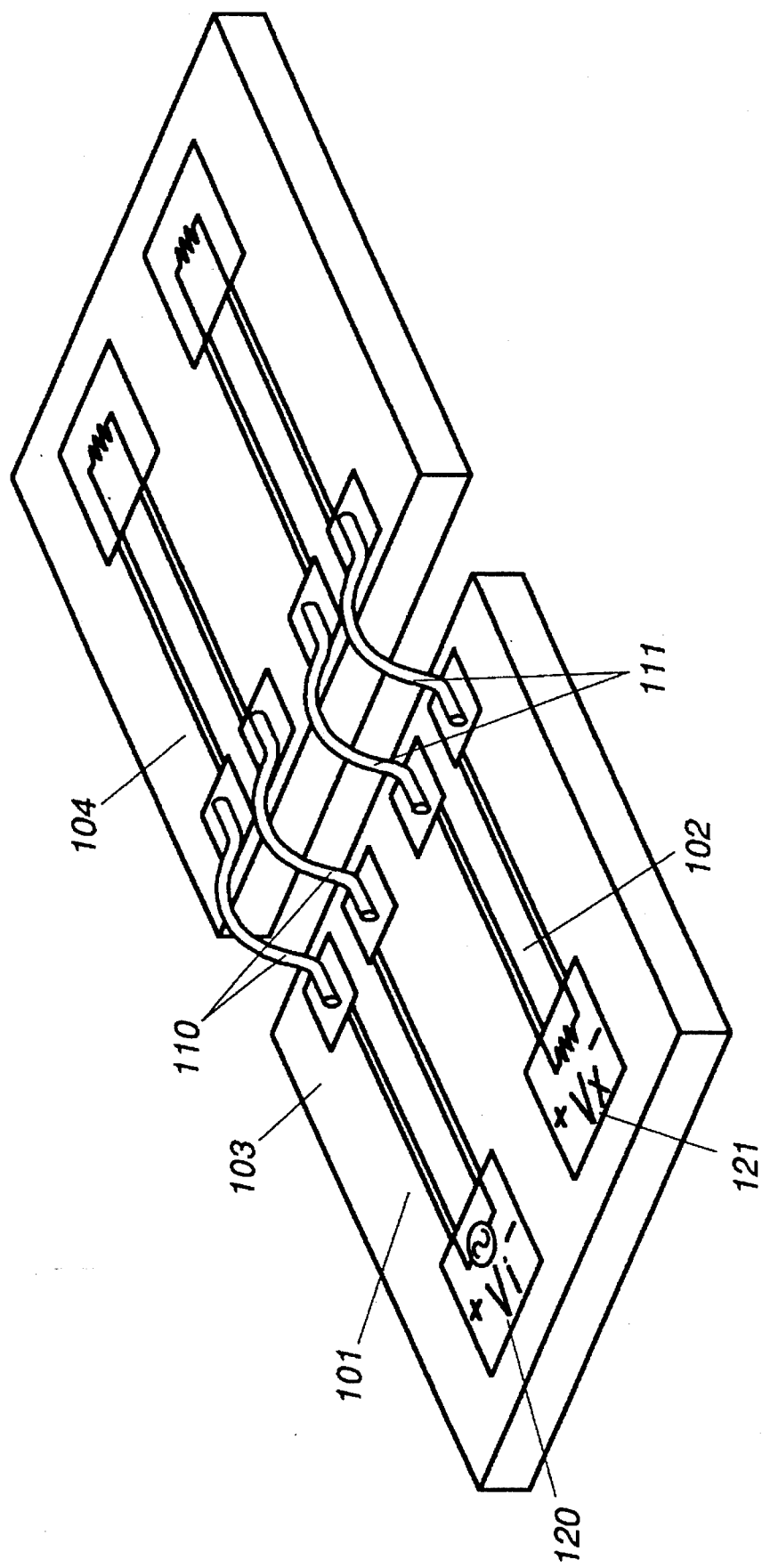
FIG. 1 is a isometric view of wire bond typical connections used in the prior art.
Figure 2:
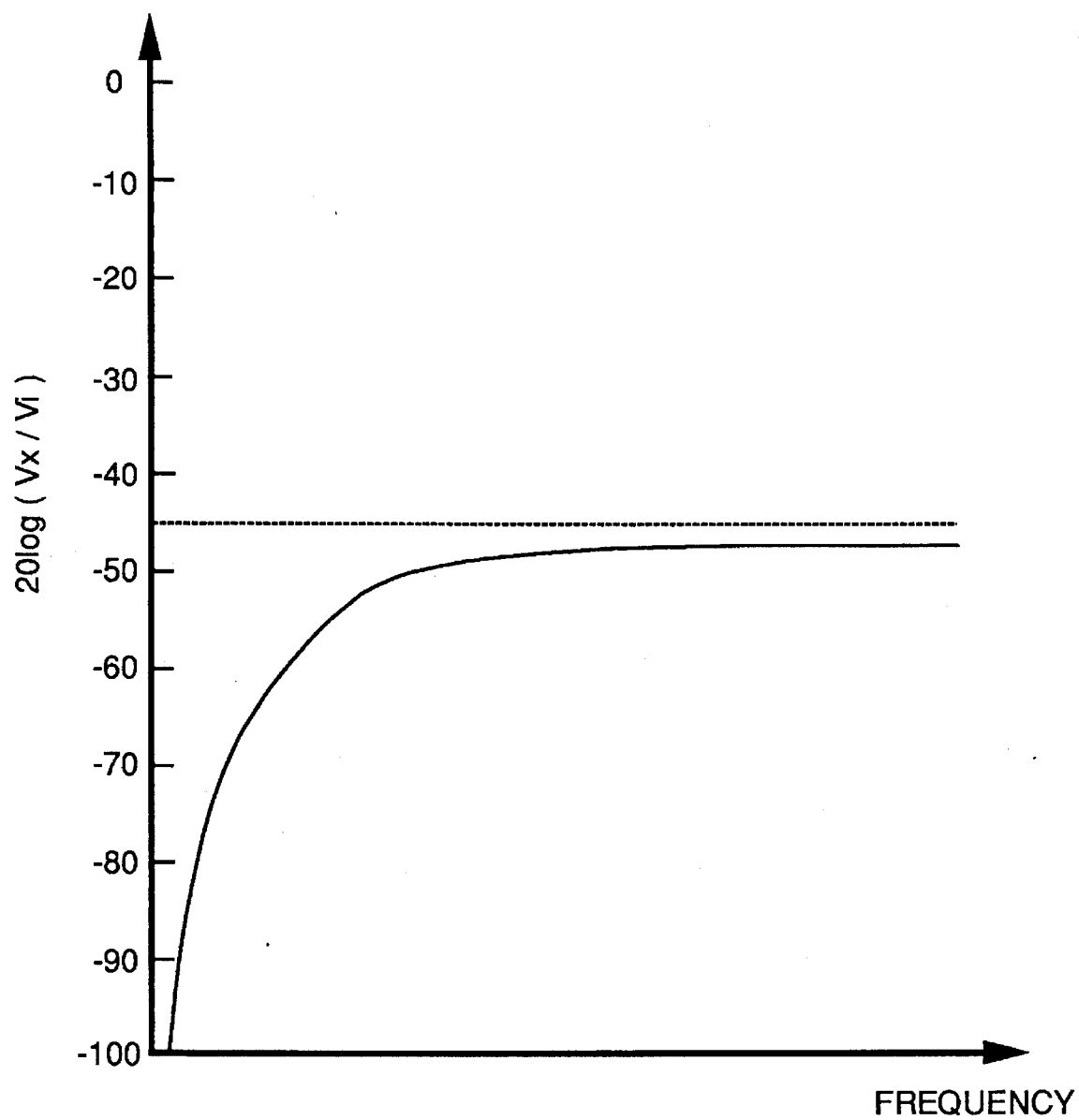
FIG. 2 is a graph illustrating typical crosstalk for the circuit shown in FIG. 1.
Figure 8:
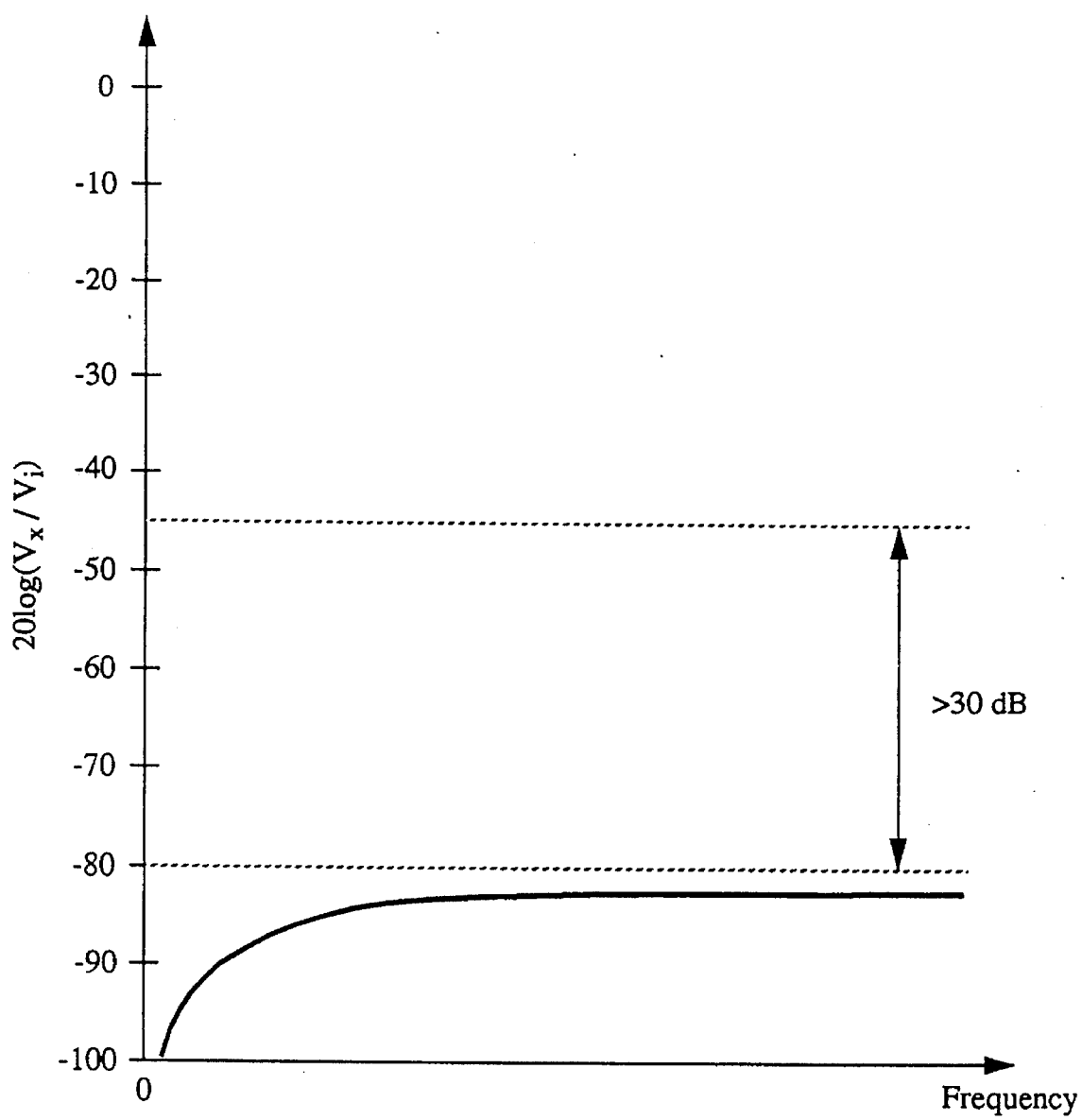
FIG. 8 is a graph illustrating typical crosstalk reduction using the spatially separated twisted pair using a structure as seen in FIG. 7.

FIG. 8 is a graphical representation illustrating the reduced crosstalk of the spatially separated twisted pairs 701, 702 as seen in FIG. 7. The graph represents crosstalk as a ratio voltages present on two adjacent circuits 720, 721 versus frequency. For example, when the spatially separated twisted pairs 701,702 are used to replace bond pairs 110 and 111, in a typical circuit like that shown in prior art FIG. 1, the graph clearly shows a great reduction in crosstalk between the two adjacent networks 720,721 with a lower voltage ratio present at 723, 725.

While the preferred embodiments of the invention have been illustrated and described, it will be clear that the invention is not so limited. Numerous modifications, changes, variations, substitutions and equivalents will occur to those skilled in the art without departing from the spirit and scope of the present invention as defined by the appended claims.

What is claimed is:

1. A device for reducing coupling between electrical circuits comprising:

a first uninsulated conductor;

a second uninsulated conductor, and wherein said first uninsulated conductor and said second uninsulated conductor are positioned about one another to form substantially a helical portion without either of said first uninsulated conductor or said second uninsulated conductor making physical contact with each other or any other material in said helical portion.

2. A device as in claim 1 wherein said first uninsulated conductor and said second uninsulated conductor are wire bond.

3. A radio frequency electrical connection for reducing crosstalk between electrical devices comprising:

a first bond wire and a second bond wire which are positioned adjacently; and said first bond wire and second bond wire are interwoven into a plurality of sections without making physical contact with each other or any other material, wherein said sections form a substantially spiral shape.

4. A method of forming a twisted pair comprising the steps of:

positioning a first uninsulated wire adjacent to a second uninsulated wire; and twisting said first uninsulated wire about said second uninsulated wire such that said first uninsulated wire and said second uninsulated wire form a helical portion but do not come into physical contact with each other or any other material in the helical portion.

5. A method of forming a twisted pair as in claim 4 wherein said first uninsulated wire and said second uninsulated wire are bond wire.

6. A method of forming a twisted pair as in claim 4 wherein said twisting is performed with a wire bonding machine.

* * * * *